US009480192B2

(12) United States Patent
Jang et al.

(10) Patent No.: US 9,480,192 B2
(45) Date of Patent: *Oct. 25, 2016

(54) MAGNETIC FIELD SHIELDING SHEET, METHOD OF MANUFACTURING THE SAME AND PORTABLE TERMINAL DEVICE USING THE SAME

(71) Applicant: AMOSENSE CO., LTD., Cheonan-si (KR)

(72) Inventors: Kil Jae Jang, Seongnam-si (KR); Dong Hoon Lee, Yongin-si (KR); Ki Chul Kim, Incheon (KR)

(73) Assignee: AMOSENSE CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/651,408

(22) PCT Filed: Dec. 13, 2013

(86) PCT No.: PCT/KR2013/011582
§ 371 (c)(1),
(2) Date: Jun. 11, 2015

(87) PCT Pub. No.: WO2014/092500
PCT Pub. Date: Jun. 19, 2014

(65) Prior Publication Data
US 2015/0334886 A1 Nov. 19, 2015

(30) Foreign Application Priority Data
Dec. 14, 2012 (KR) ........................ 10-2012-0146609

(51) Int. Cl.
*B32B 3/02* (2006.01)
*H05K 9/00* (2006.01)
(Continued)

(52) U.S. Cl.
CPC ............... *H05K 9/0086* (2013.01); *B32B 7/06* (2013.01); *B32B 7/12* (2013.01); *B32B 27/06* (2013.01);
(Continued)

(58) Field of Classification Search
CPC ........... B32B 7/06; B32B 7/12; B32B 27/06; B32B 27/36; B32B 2307/702; B32B 2457/00; Y10T 428/24802
See application file for complete search history.

(56) References Cited

U.S. PATENT DOCUMENTS

| 5,260,128 A | 11/1993 | Ishii et al. |
| 6,136,429 A | 10/2000 | Saito |
| 7,172,660 B2 | 2/2007 | Song et al. |

FOREIGN PATENT DOCUMENTS

| JP | 10322085 | 12/1998 |
| KR | 1020030086122 | 11/2003 |
| KR | 1020050015563 | 2/2005 |

OTHER PUBLICATIONS

International Search Report—PCT/KR2013/011582 dated Mar. 17, 2014.

*Primary Examiner* — Elizabeth Mulvaney
(74) *Attorney, Agent, or Firm* — Cantor Colburn LLP

(57) ABSTRACT

Provided is a magnetic field shielding sheet including: an amorphous ribbon which is formed into a plurality of pieces; a cover layer which is bonded on one surface of the amorphous ribbon; a double-sided tape which is adhered on the other surface of the amorphous ribbon; and an adhesive film which is filled in gaps between the plurality of pieces, to prevent water from penetrating into the gaps. Accordingly, the amorphous ribbon is prevented from being oxidized with no result of causing an appearance problem and lowering shielding performance, due to oxidizing of the amorphous ribbon.

16 Claims, 11 Drawing Sheets

(51) Int. Cl.
  B32B 7/06 (2006.01)
  B32B 7/12 (2006.01)
  B32B 27/06 (2006.01)
  B32B 27/36 (2006.01)

(52) U.S. Cl.
  CPC .......... *B32B 27/36* (2013.01); *B32B 2307/212* (2013.01); *B32B 2307/702* (2013.01); *B32B 2457/00* (2013.01); *Y10T 156/10* (2015.01); *Y10T 428/24851* (2015.01)

MAGNETIC FIELD SHIELDING SHEET, METHOD OF MANUFACTURING THE SAME AND PORTABLE TERMINAL DEVICE USING THE SAME

TECHNICAL FIELD

The present invention relates to a magnetic field shielding sheet which shields magnetic fields generated from various components of a main body of a portable terminal device, and more particularly to, a magnetic field shielding sheet which blocks humidity from being penetrated into an amorphous ribbon to thereby prevent a problem in appearance and performance degradation due to oxidation, a method of manufacturing the magnetic field shielding sheet, and a portable terminal device using the magnetic field shielding sheet.

BACKGROUND ART

In recent years, various functionalities such as radio frequency identifications (RFIDs), near field communications (NFCs), wireless chargers, or pen tablets have been added in portable terminal devices such as smart phones, tablet personal computers (PCs), or notebooks. Since most of the various functionalities added in the portable terminal devices use the magnetic fields, magnetic fields of 100 kHz~several tens of MHz are generated. The magnetic field generated from the portable terminal device will affect various components such as a battery incorporated in the mobile terminal device.

Thus, it is necessary to use a magnetic field shielding sheet in a portable terminal device, in order to prevent components such as a battery of the portable terminal device from being influenced due to a magnetic field generated from the portable terminal device, and in order to improve an ability of using the magnetic field by focusing the magnetic field.

An electromagnetic wave shielding member using a conventional ribbon, as disclosed in Korean Patent Publication No. 10-0460297 (on Nov. 26, 2004), includes: a metal ribbon composed of any one metal or alloy selected from the group consisting of Ni—Fe—Mo, Fe—Si and mu-metal and whose relative magnetic permeability is 1000 or more, in which the thickness of the metal ribbon is between 1 μm and 900 μm, and the width of the metal ribbon is in the range of from 1 mm to 90 mm; and an adhesive layer formed on at least one side of the metal ribbon.

Such a conventional electromagnetic wave shielding member may cause radiation to the opposite side of the metal ribbon which a magnetic field enters, in which the magnetic field passes through and along the plane of the metal ribbon when the magnetic field is applied from outside along the side of the metal ribbon in the case that the metal ribbon is in a flat plate form. As a result, a geomagnetic sensor which employs the conventional electromagnetic wave shielding member may cause a sensitivity strength difference in the X-, Y-, and/or Z-direction, to thereby cause a problem that an angular error occurs.

Then, in the case that the metal ribbon is flake-processed to then be divided into a plurality of flakes or to then be formed into cracks, even if a magnetic field is applied from the outside along one side of the metal ribbon, the magnetic field is attenuated while passing through the flakes or cracks, and thus the magnetic field does not nearly radiate to the opposite side of a magnetic field shielding sheet which the magnetic field enters.

However, in the case of flake-processing a Fe-based metal ribbon, moisture may penetrate into the gap between the flakes or cracks of the metal ribbon to thereby cause a problem that the metal ribbon is easily oxidized.

Thus, as described above, when the metal ribbon is oxidized, a problem in appearance is generated, and the characteristics of elements combined with oxygen may be changed to thus cause a problem that the shielding property decreases.

DISCLOSURE

Technical Problem

To solve the above problems or defects, it is an object of the present invention to provide a magnetic field shielding sheet which is configured by flake-processing an amorphous ribbon to thus be formed into a large number of fine flake pieces, and filling gaps between the fine flake pieces with an adhesive to thus prevent moisture from being penetrated into the gaps, and to thereby prevent the flake-processed amorphous ribbon from being oxidized with no result of causing an appearance problem and lowering shielding performance, its manufacturing method and a portable terminal device using the magnetic field shielding sheet.

It is another object of the present invention to provide a magnetic field shielding sheet which is configured so that magnetic permeability of the magnetic field shielding sheet is reduced into the optimum magnetic permeability by overheating a Fe-based amorphous alloy ribbon at a temperature of a critical temperature or higher when the Fe-based amorphous alloy ribbon is heat-treated, thus improving the sensitivity of a digitizer, having no influence upon a geomagnetic sensor, and shielding an electromagnetic field generated from various components of a main body of a portable terminal device, a manufacturing method thereof and a portable terminal device using the magnetic field shielding sheet.

The technical problems to be solved in the present invention are not limited to the above-mentioned technical problems, and the other technical problems that are not mentioned in the present invention may be apparently understood by one of ordinary skill in the art in the technical field to which the present invention belongs.

Technical Solution

To accomplish the above and other objects of the present invention, according to an aspect of the present invention, there is provided a magnetic field shielding sheet comprising: an amorphous ribbon which is formed into a plurality of pieces; a cover layer which is bonded on one surface of the amorphous ribbon; a double-sided tape which is adhered on the other surface of the amorphous ribbon; and an adhesive film which is filled in gaps between the plurality of pieces, to prevent water from penetrating into the gaps.

Preferably but not necessarily, the amorphous ribbon is made of a Fe-based amorphous alloy, which is heat treated at a first temperature range of 440° C. to 480° C.

Preferably but not necessarily, the cover layer comprises a first adhesive layer bonded on one surface of the amorphous ribbon and a cover film formed on the first adhesive layer, the double-sided tape comprises a substrate, a second adhesive layer formed on one surface of the substrate and on the other surface of the amorphous ribbon, and a third adhesive layer bonded on the other surface of the substrate, and the adhesive film is formed in the case that some of the adhesive of the first adhesive layer and the second adhesive layer penetrate the gaps.

According to another aspect of the present invention, there is also provided a method of manufacturing a magnetic field shielding sheet, the method comprising the steps of: heat-treating an amorphous ribbon; forming a cover layer on one surface of the amorphous ribbon; forming a double-sided tape on the other surface of the amorphous ribbon; flake-processing the amorphous ribbon on both surfaces of which the cover layer and the double-sided tape are respectively formed to thus be formed into a plurality of flake pieces; and forming an adhesive film for preventing water from penetrating in the gaps between the plurality of flake pieces.

Preferably but not necessarily, the heat-treatment of the amorphous ribbon is in progress for 30 minutes~2 hours at a temperature of 440° C.~480° C.

Preferably but not necessarily, the flake-processing is performed by making the amorphous ribbon on one surface of which the cover layer is formed and on the other surface of which the double-sided tape is formed pass through a first pressing unit consisting of a metal roller and a rubber roller which have irregularities, to then be separated into the plurality of flake pieces.

Preferably but not necessarily, the flake-processing is performed by making the amorphous ribbon on one surface of which the cover layer is formed and on the other surface of which the double-sided tape is formed pass through a first pressing unit consisting of a metal roller on the outer surface of which a plurality of spherical balls are mounted and a rubber roller which is arranged at a predetermined distance from the metal roller, to then be separated into the plurality of flake pieces.

Preferably but not necessarily, the forming the adhesive film is performed in the case that some of a first adhesive layer of the cover layer and a second adhesive layer of the double-sided tape are filled in gaps formed between the plurality of flake pieces, by pressing the magnetic field shielding sheet at the room temperature or at a heat-applied temperature with a second pressing unit.

Preferably but not necessarily, the second pressing unit employs one of a roll press type composed of a first pressing roller and a second pressing roller which are disposed at a predetermined interval, and a hydraulic press type composed of a lower pressing member and an upper pressing member which is disposed on the upper side of the lower pressing member which moves up and down, and the spacing between the first pressing roller and the second pressing roller and the spacing between the upper pressing member and the lower pressing member which move in the lower direction are set to be 50% or less when compared to the thickness of the shielding sheet before being pressed.

According to still another aspect of the present invention, there is also provided a magnetic field shielding sheet comprising: a plurality of amorphous ribbons between which a plurality of first double-sided tapes are inserted and laminated; a cover layer which is bonded on one exposed surface of each of the amorphous ribbons; and a second double-sided tape which is adhered on the other surface of each of the amorphous ribbons, wherein each of the amorphous ribbons is made of a plurality of pieces having a gap therebetween, and some of the adhesive included in the cover layer, and the first and second double-sided tapes are penetrated into the gaps to prevent water from being penetrated into the gaps.

Advantageous Effects

As described above, the magnetic field shielding sheet according to the present invention is configured by flake-processing a shielding sheet with a first pressing unit to thereby form an amorphous ribbon into a plurality of fine flake pieces, and pressing the shield sheet with a second pressing unit to thereby make some of adhesives of a first adhesive layer of a cover layer and a second adhesive layer of a double-sided tape filled in gaps between the plurality of fine flake pieces, with a result that moisture can be prevented from penetrating into the gaps and thus with no result of causing an appearance problem and lowering shielding performance.

The magnetic field shielding sheet according to the present invention is configured so that magnetic permeability of the magnetic field shielding sheet is reduced into the optimum magnetic permeability by overheating a Fe-based amorphous alloy ribbon at a temperature of a critical temperature or higher when the Fe-based amorphous alloy ribbon is heat-treated, thus improving the sensitivity of a digitizer, having no influence upon a geomagnetic sensor, and shielding an electromagnetic field generated from various components of a main body of a portable terminal device.

BEST MODE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
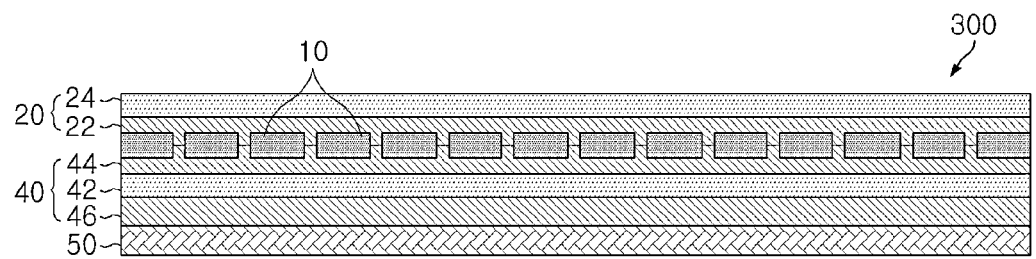
FIG. 1 is a cross-sectional view of a magnetic field shielding sheet according to an embodiment of the present invention.
Figure 2:
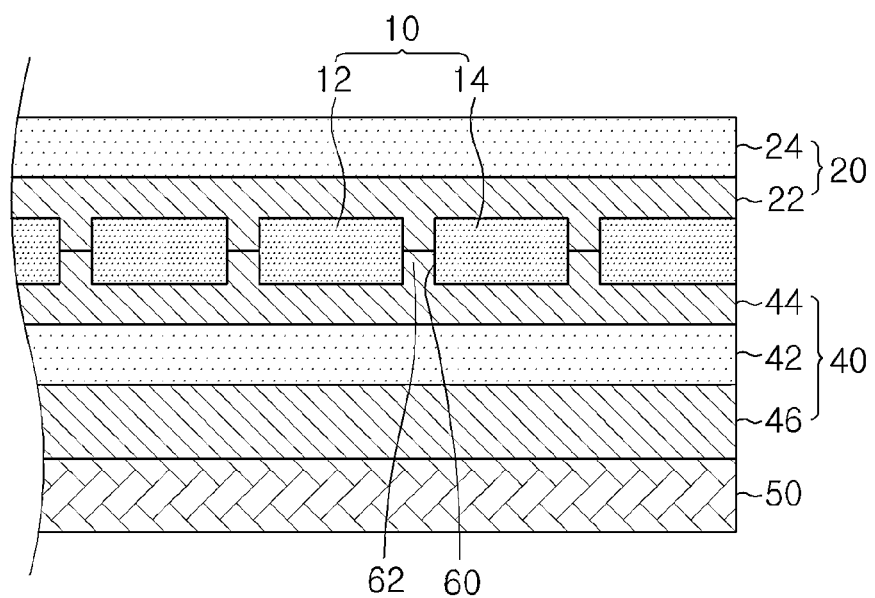
FIG. 2 is a partially enlarged cross-sectional view of the magnetic shield sheet according to an embodiment of the present invention.

FIG. 1 is a cross-sectional view of a magnetic field shielding sheet according to an embodiment of the present invention, and FIG. 2 is a partially enlarged cross-sectional view of the magnetic shield sheet according to an embodiment of the present invention.

Referring to FIGS. 1 and 2, the magnetic field shielding sheet 300 according to an embodiment of the present invention includes: an amorphous ribbon 10 (such as an amorphous alloy ribbon or strip) which is flake-processed to then be formed into a plurality of fine flake pieces; a cover layer 20 which is bonded on one surface of the amorphous ribbon 10; a double-sided tape 40 which is adhered on the other surface of the amorphous ribbon 10; and an adhesive film 62 which is filled in gaps 60 between the plurality of fine flake pieces 12 and 14, to prevent water from penetrating into the gaps 60.

For example, the amorphous ribbon 10 may be a thin plate ribbon made of a Fe-based magnetic alloy.

For example, the Fe-based magnetic alloy may be a Fe—Si—B alloy, and it is preferable that Fe should be in the range of 70-90 atomic %, and the sum of Si and B should be in the range of 10-30 atomic %. The higher the content of a metal including Fe, the higher a saturation magnetic flux density becomes, but if the content of Fe is excessive, it is difficult to form an amorphous state. Thus, in the present invention, it is preferable that the content of Fe should be in the range of 70-90 atomic %. In addition, an amorphous state forming ability of the alloy is the most excellent when the range of the sum of Si and B is in the range of 10-30 atomic %. In order to prevent corrosion, a corrosion-resistant element such as Cr may be also added to the basic composition within a few atomic %, and a small amount of other metal elements necessary to impart different properties may be included in the basic composition.

For example, the Fe—Si—B alloy whose crystallization temperature is 508° C. and whose Curie temperature (Tc) is 399° C. can be used in the present invention. However, the crystallization temperature may be varied depending on the content of Si and B, or the other metal elements and the content thereof to be added in addition to a ternary alloy composition.

In the present invention, a Fe—Si—B—Co-based alloy can be used as the Fe-based amorphous ribbon, as needed.

Fe-based amorphous ribbons can be made into wide-width ribbons of about 100 mm or wider. As a result, the magnetic field shielding sheet can be applied even in the case of a large display whose area is larger than that of a smart phone, for example, a portable terminal device whose width is about 100 mm, in which two sheets of ribbons are not used after being butted in the longitudinal direction, but a single sheet of a wide-width ribbon can be cut to become a magnetic field shielding sheet for the portable terminal device whose width is 100 mm.

Thus, in the case of a nanocrystalline ribbon that is formed by butting or overlapping two sheets typically having a width of 50 mm in the longitudinal direction, a variation in the permeability has encountered between the ribbons or in the connecting portion of the ribbons, and thus a digitizer causes a problem that it is difficult to indicate a uniform characteristic. However, the present invention using a single sheet of a wide-width ribbon may eliminate such a local permeability variation.

The amorphous ribbon 10 may have a thickness of 15 μm to 35 μm, for example. In this case, in consideration of a handling process after the heat treatment of the amorphous ribbon 10, a thickness of the amorphous ribbon 10 is preferably set to be in the range of 25 μm to 30 μm. The thinner the thickness of the amorphous ribbon 10 may become, a breakage phenomenon of the amorphous ribbon 10 may occur due to even a little shock at the time of performing a handling process after the heat treatment.

Then, the amorphous ribbon 10 is flake-processed to be formed into a plurality of flake pieces, in which the plurality of flake pieces 12 and 14 are preferably formed to be in the range of several μm to 3 mm.

The cover layer 20 includes: a first adhesive layer 22 which is attached on a surface of the amorphous ribbon 10; and a cover film 24 which is formed on the first adhesive layer 22 and for protecting the amorphous ribbon 10.

The cover film 24 may be preferably formed of a PET (Polyethylene Terephthalate) film and any material whose thickness is thin and which can protect the amorphous ribbon 10 can be used as the cover film 24 in addition to the PET film.

In addition, the first adhesive layer 22 plays the role of attaching the cover film 24 onto one surface of the amorphous ribbon 10, and a portion of the first adhesive layer 22 is filled in the gaps 60 between the plurality of flake pieces 12 and 14, when the magnetic field shielding sheet is heated and pressed in the manufacturing process of when the magnetic field shielding sheet, to thereby form the adhesive film 62.

Thus, a thermoplastic adhesive which may be deformed when being pressed while heating may be used as the first adhesive layer 22. Otherwise, any adhesive which may be deformed when being pressed at the room temperature may be used as the first adhesive layer 22.

In addition, since the first adhesive layer 22 maintains an adhesive strength in order to bond the cover film 24 on one surface of the amorphous ribbon 10, and a portion of the adhesive of the first adhesive layer 22 should be filled in the gaps 60 between the plurality of flake pieces 12 and 14, the thickness of the first adhesive layer 22 is preferably formed in a thickness of at least 50% compared to that of the amorphous ribbon 10.

As an example, the thickness of the cover film 24 and the thickness of the first adhesive layer 22 may be in the range of 10~100 µm, preferably having a thickness of 30 µm.

The double-sided tape 40 includes: a substrate 42; a second adhesive layer 44 formed on one surface of the substrate 42 and bonded on the other surface of the amorphous ribbon 10; and a third adhesive layer 46 formed on the other surface of the substrate 42 and bonding a magnetic field shielding sheet on a component to achieve electromagnetic shielding.

In addition, a release film 50 is attached on the third adhesive layer 46 to protect the third adhesive layer 46 in which the release film 50 is peeled off when a magnetic field shielding sheet is attached on the third adhesive layer 46.

A PET (Polyethylene Terephthalate) film may be used as the substrate 42 so as to support a double-sided tape to have a sufficient strength, and a thermoplastic adhesive which may be deformed when being pressed while heating at a temperature of the room temperature or higher or an adhesive which may be deformed when being pressed at the room temperature can be used as the second adhesive layer 44 and the third adhesive layer 46 similarly to the first adhesive layer 20.

Here, the thickness of the double-sided tape 40 may be used in the range of 10 µm~100 µm, preferably having a thickness of 30 µm.

When the second adhesive layer 44 is pressed at the room temperature or at a heat-applied temperature, a portion of the second adhesive layer 44 is filled in the gaps 60 between the plurality of flake pieces 12 and 14 to thus form the adhesive film 62.

Thus, since the second adhesive layer 44 maintains an adhesive strength in order to bond the double-sided tape 40 on the other surface of the amorphous ribbon 10, and a portion of the adhesive of the second adhesive layer 44 should be filled in the gaps 60 between the plurality of flake pieces 12 and 14, the thickness of the second adhesive layer 44 is preferably formed in a thickness of at least 50% compared to that of the amorphous ribbon 10.

The adhesive film 62 has a structure capable of preventing water from penetrating into the gaps 60 since a portion of the first adhesive layer 22 flows into the gaps 60 and that of the second adhesive layer 44 also flows into the gaps 60, when both sides of the magnetic field shielding sheet are pressed at the room temperature or at a heat-applied temperature.

In this way, the adhesive film 62 may block water from flowing into the gaps fundamentally since the adhesive film 62 may fill the gaps 60 between the flake pieces 12 and 14. Accordingly, since it is possible to prevent oxidation of the amorphous ribbon 10, it is possible to prevent the appearance of an amorphous ribbon 10 from being deformed or prevent some performance from lowering.

In addition, a separate process and a separate adhesive may be unnecessary to fill the gaps 60 between the pieces 12 and 14, to thus save the manufacturing process and cost. That is, when both sides of the magnetic field shielding sheet are pressed at the room temperature or at a heat-applied temperature after the magnetic field shielding sheet has been prepared, a portion of the first adhesive layer 22 which serves to adhere the cover film 24 to one surface of the amorphous ribbon 10 flows into the gaps 60, and a portion of the second adhesive layer 44 of the double-sided tape 40 which serves to attach a magnetic field shielding sheet on another component flows into the gaps 60, to thereby form the adhesive film 62. Accordingly, a separate adhesive and process is unnecessary to form the adhesive film.

Figure 3:
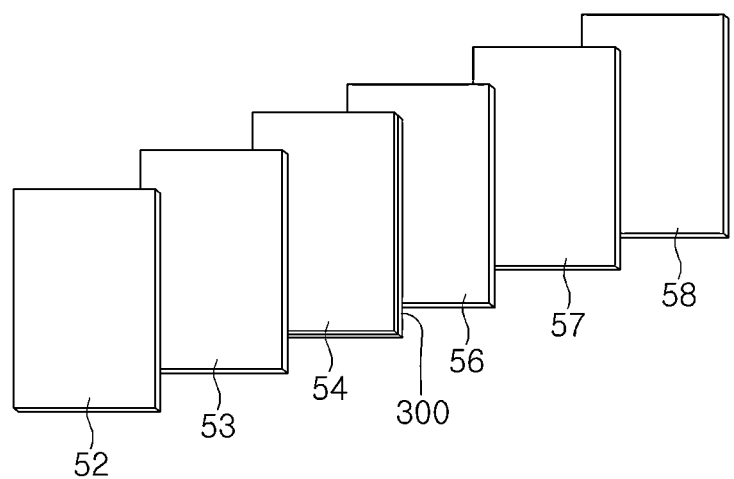
FIG. 3 is an exploded perspective view of a portable terminal having a magnetic field shielding sheet according to an embodiment of the present invention.

FIG. 3 is an exploded perspective view of a portable terminal device to which a magnetic field shielding sheet is applied according to an embodiment of the present invention.

As shown in FIG. 3, a portable terminal device includes a touch screen panel 52, a display panel 53, a digitizer panel 54, a magnetic field shielding sheet 300, a bracket 56, a main circuit board 57 and a rear cover 58 which are sequentially combined one after another. Then, a battery can be mounted in the inside of the bottom cover 58.

In this way, the magnetic field shielding sheets 300 are mounted between the digitizer panel 54 using an application of the magnetic field and the main circuit board 57 on which various circuit components are mounted, and between the main circuit board 57 and the battery in the portable terminal device according to the present embodiment, to thus prevent a magnetic field generated from the main circuit board 57 from affecting the digitizer panel 54, or a magnetic field generated from the digitizer panel 54 from affecting the various circuit components mounted on the main circuit board 57 and the battery, and to thereby focus the magnetic fields to enhance the functionality of the digitizer panel 54.

The magnetic field shielding sheet 300 according to this embodiment may be disposed in the various components which generate magnetic fields, in addition to the digitizer panel, to thereby serve to shield the magnetic fields.

In the following, a method of manufacturing the magnetic field shielding sheet according to an embodiment of the present invention will be described.

Figure 4:
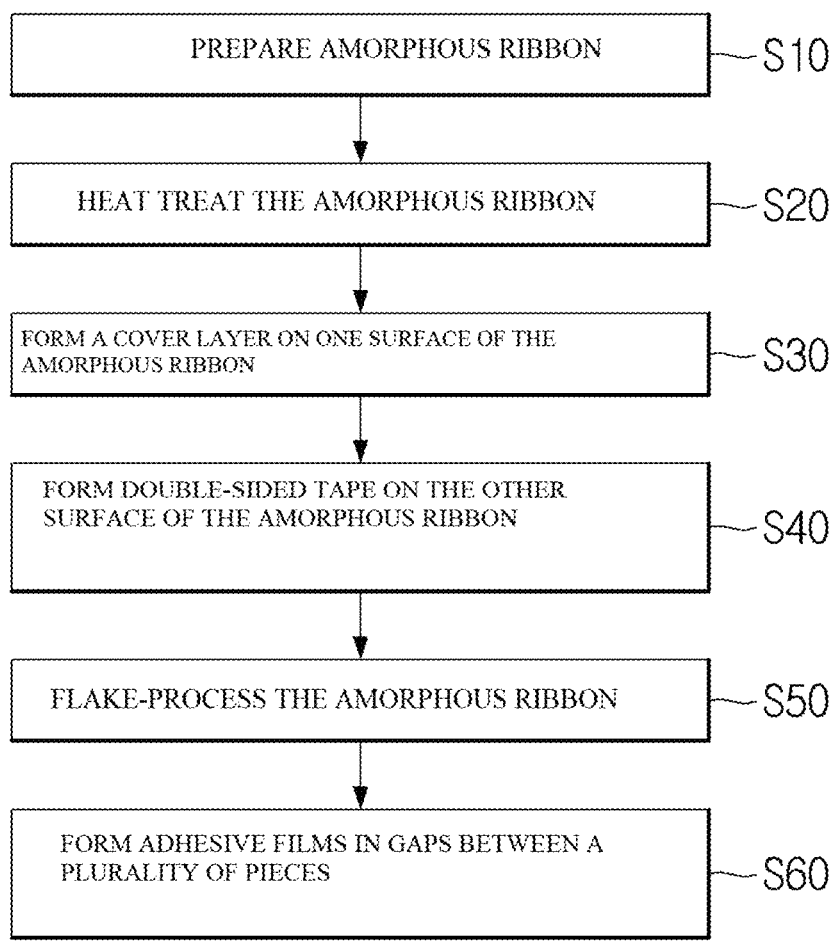
FIG. 4 is a flowchart view illustrating a method of manufacturing a magnetic field shielding sheet according to an embodiment of the present invention.

FIG. 4 is a flowchart illustrating a method of manufacturing a magnetic field shielding sheet according to an embodiment of the present invention.

First, a Fe-based amorphous ribbon, e.g., an ultra-thin amorphous ribbon equal to or less than 30 µm made of a Fe—Si—B alloy is prepared by a rapidly solidification process (RSP) due to melt spinning, and is cut in a predetermined length to then be laminated in a sheet form so that post-processing after a heat treatment can be easily performed (S10).

A desired range of the permeability (inductance) of the amorphous ribbon 10 in the present invention should be set to have permeability that does not affect a geomagnetic sensor, and that shields a magnetic field generated from a main body of a portable terminal device so as not to affect a digitizer and so as to improve sensitivity of the digitizer at the same time.

A range of permeability satisfying the condition of the amorphous ribbon 10 is preferably in the range of 15 µH to 18 µH based on the inductance.

The amorphous ribbon is heat-treated under a non-magnetic field circumstance for 30 minutes to 2 hours in a second temperature range ($T_o$) of 445° C. ($T_3$) to 460° C. ($T_4$), as illustrated in FIG. 11, to thereby obtain an amorphous ribbon 10 having a desired range of a permeability value (an inductance value) (S20).

In this case, according to the heat treatment atmosphere, since the heat treatment is performed in a temperature range so that oxidation does not occur, even though the Fe content of the amorphous ribbon 10 is high, the heat treatment is not necessary to be made in an atmosphere furnace, but it may be sufficient to perform the heat treatment in the air. Further, even if the heat treatment takes place in an oxidizing atmosphere or a nitrogen atmosphere, the permeability of the amorphous ribbon is not substantially different at an identical temperature condition.

Figure 11:
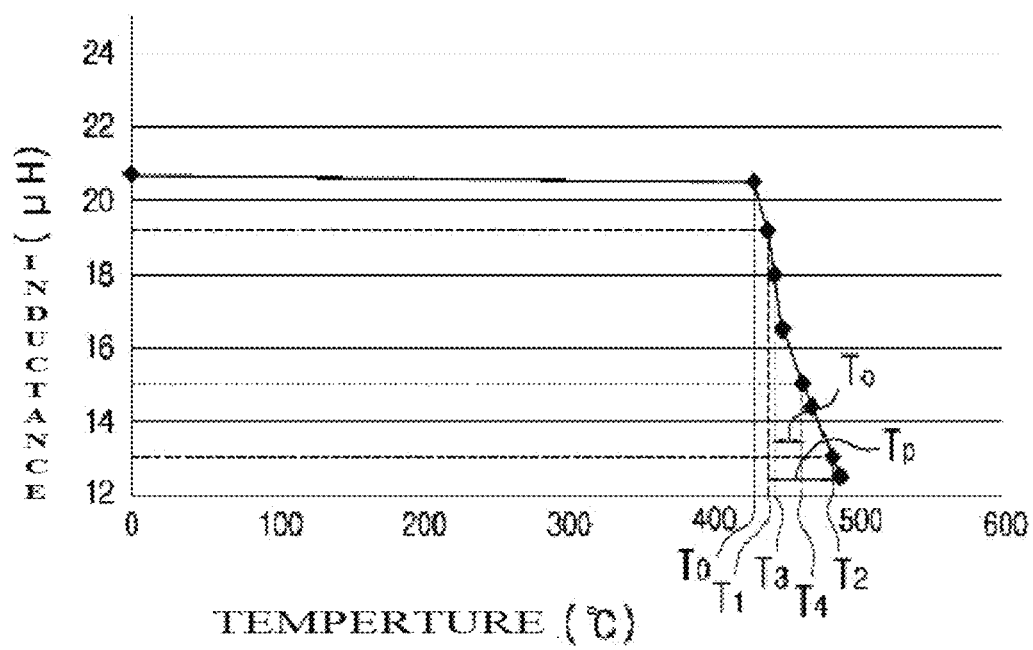
FIG. 11 is a graph showing the relationship between a heat treatment temperature of a Fe-based amorphous ribbon sheet used for a magnetic field shielding sheet according to the present invention and an inductance (magnetic permeability) of the magnetic field shielding sheet.

As shown in FIG. 11, the Fe-based amorphous ribbon 10 made of the Fe—Si—B alloy is maintained to have an inductance value of about 20.7 µH (here, the permeability is proportional to the inductance value) when the heat treatment temperature is 430° C. ($T_o$) or less. As the heat treatment temperature increases from the starting point 430° C. ($T_o$), the surface resistance of the ribbon increases while the partial crystallization is created. Accordingly, the inductance (the permeability) is reduced abruptly.

Therefore, the amorphous ribbon 10 is obtained as follows. The Fe—Si—B alloy is made in an amorphous ribbon or strip form, and then heat-treated under a non-magnetic field circumstance for 30 minutes to 2 hours in a second temperature range ($T_o$) of 445° C. ($T_3$) to 460° C. ($T_4$), to thereby obtain an amorphous ribbon 10 having a permeability value (an inductance value) in a desired range through a method of reducing inductance (permeability).

The permeability of the amorphous ribbon 10 may be converted from an inductance value of an obtained amorphous ribbon, for example, after measuring the inductance value of the amorphous ribbon 10 under the conditions of 100 kHz and 1 V applied to an LCR meter (which is a piece of electronic test equipment used to measure the inductance (L), capacitance (C), and resistance (R) of a component), by using a coil of 12.1 µH.

In the case that the heat treatment temperature is less than 445° C. ($T_3$) so as to satisfy the range of the inductance (permeability), there is a problem of exhibiting permeability higher than desired permeability and consuming a long heat treatment time. In the case that the heat treatment temperature exceeds 460° C. ($T_4$), permeability is remarkably lowered through an overheating process, to thereby cause a problem of exhibiting undesired permeability. In general, if the heat treatment temperature is low, it takes a long processing time, whereas if the heat treatment temperature is high, the processing time tends to be shortened.

Meanwhile, the Fe-based amorphous ribbon 10 according to the present invention has a thickness of a 15 µm to 35 µm range, and the permeability of the Fe-based amorphous ribbon 10 is increased in proportion to the thickness of the ribbon.

Further, the amorphous ribbon is heat-treated according to non-uniformity of the raw material of the ribbon, thickness of the ribbon, and the internal environment of a heat treatment furnace, and the permeability of the heat-treated amorphous ribbon 10 can cause individual variations.

However, the heat treatment condition in the second temperature range $T_0$ for the Fe-based amorphous ribbon 10 is the condition required for the case that a distance between the magnetic field shielding sheet using the amorphous ribbon 10 and the geomagnetic sensor is set to have an interval of about 2 mm.

If the distance between the magnetic field shielding sheet and the geomagnetic sensor is set to be within 2 mm, permeability of the amorphous ribbon 10 can be set to become lower, while if the distance between the magnetic field shielding sheet and the geomagnetic sensor is set to be greater than 2 mm, permeability of the amorphous ribbon 10 can be also set to become higher.

Therefore, when considering the permeability in this wide range, the heat treatment condition in the Fe-based amorphous ribbon 10 can be set to be 30 minutes to 2 hours in a first temperature range (Tp) of 440° C. ($T_1$) to 480° C. ($T_2$).

Further, if an overheating process is performed at a temperature between 430° C. and 500° C., a sheet having desired permeability can be easily produced by using a property in which the inductance value of the sheet is reduced substantially linearly.

Furthermore, when the amorphous ribbon is overheated in the first temperature range (Tp) of 440° C. ($T_1$) to 480° C. ($T_2$), brittleness is made strong and thus flakes can be easily made when the flake-processing is performed in the subsequent step.

Then, the cover layer 20 is formed on one surface of the heat-treated amorphous ribbon 10 (S30). Here, the cover layer 20 includes the first adhesive layer 22 adhered to one surface of the amorphous ribbon 10, and the cover film 24 formed on the first adhesive layer 22, to protect the amorphous ribbon 10.

In addition, the double-sided tape 40 is attached on the other surface of the amorphous ribbon 10 (S40). Here, the double-sided tape 40 includes the second adhesive layer 44 bonded on the other surface of the amorphous ribbon 10, the substrate 42 formed on the second adhesive layer 44, and the third adhesive layer 46 formed on the substrate 42 and making the magnetic field shielding sheet attached to a component in order to perform the electromagnetic shielding.

The double-sided tape 40 may be a type of including a substrate as described above, but may be a type of including no substrate but being formed of only adhesive layers.

Figure 5:
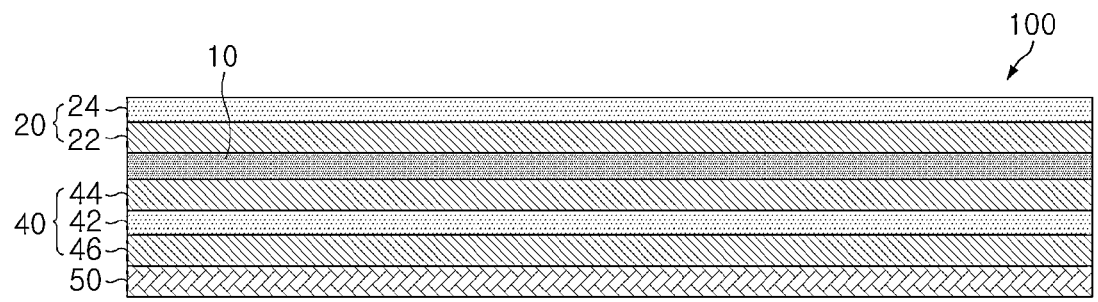
FIG. 5 is a cross-sectional view of a primary shielding sheet which is manufactured by a magnetic field shielding sheet manufacturing method according to the present invention.

Thus, when the amorphous ribbon 10, the cover layer 20 attached to one surface of the amorphous ribbon 10 and the double-sided tape 40 formed on the other surface of the amorphous ribbon 10 are completely laminated, a primary shielding sheet 100 is formed as shown in FIG. 5.

Then, the primary shielding sheet 100 is flake-processed to thus form the amorphous ribbon 10 into a plurality of flake pieces 12 and 14 (S50).

Figure 6:
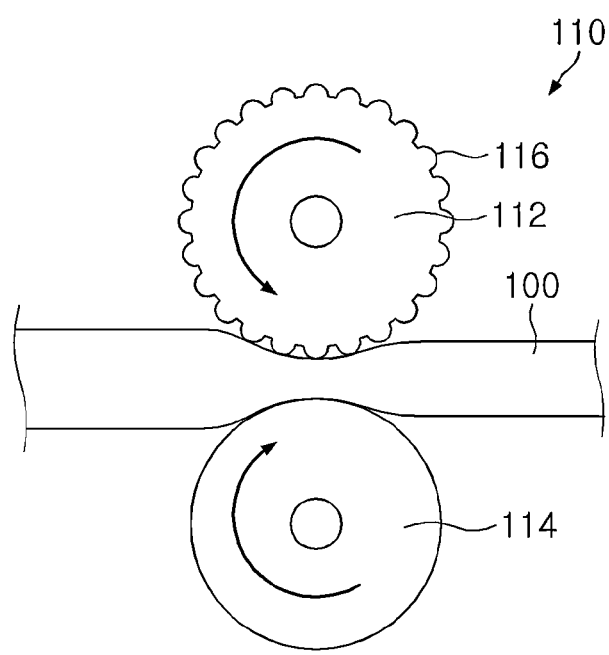
FIG. 6 is a side view showing an example of a first pressing unit in the present invention.
Figure 7:
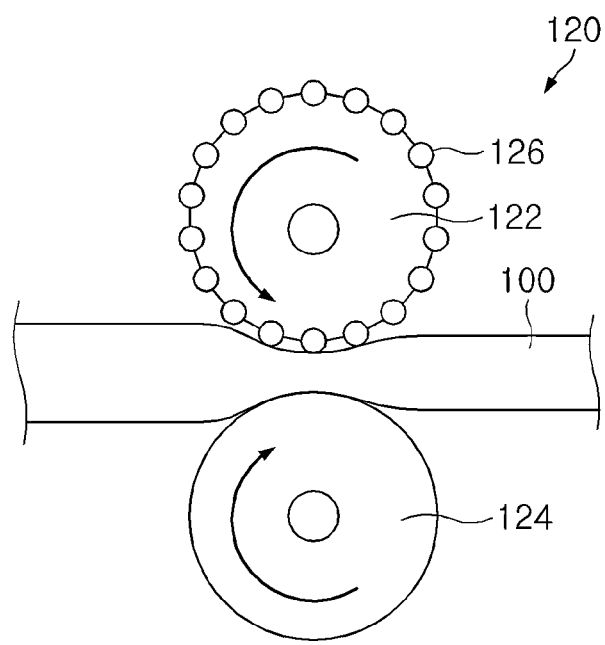
FIG. 7 is a side view showing another example of the first pressing unit in the invention.

Here, the flake-processing is a process of breaking through the amorphous ribbon into a plurality of flake pieces by making the primary shielding sheet pass through the first pressing unit 110 or 120. Here, as shown in FIG. 6, the first pressing unit 110 or 120 may consist of a metal roller 112 on the outer surface of which a plurality of irregularities 116 are formed, and a rubber roller 114 that is disposed at a certain interval in opposition to the metal roller 112. As shown in FIG. 7, the first pressing unit 110 or 120 may consist of a metal roller 122 on the outer surface of which a plurality of spherical balls 126 are mounted, and a rubber roller 124 that is disposed at a certain interval in opposition to the metal roller 122.

Thus, when the primary shielding sheet 100 in which the cover layer 20, the amorphous ribbon 10, and the double-sided tape 40 are sequentially stacked is made to pass through the first pressing unit 110 or 120, the amorphous ribbon 10 is flaked and separated into a number of the pieces 12 and 14.

Since the plurality of the pieces 12 and 14 of the amorphous ribbon 10 are formed to have a size of a range of several tens micrometers (nm) to 3 millimeters (mm), a demagnetizing field is made to increase to thereby remove a hysteresis loss and to thus heighten a uniformity of the permeability of the sheet. As a result, a uniform characteristic of a digitizer can be implemented.

Further, the flake-processing of the amorphous ribbon 10 may reduce the surface area of the ribbon and prevent a heat generation problem caused by an eddy current that is produced by an alternating-current magnetic field.

Figure 8:
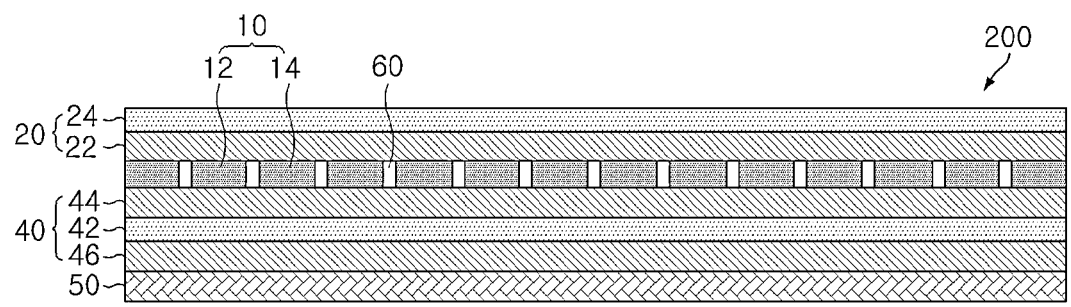
FIG. 8 is a cross-sectional view of a secondary shielding sheet which is manufactured by the magnetic field shielding sheet manufacturing method according to the present invention.

In this way, when the flake-processing of the amorphous ribbon 10 is completed, as shown in FIG. 8, the amorphous ribbon 10 is formed into a plurality of pieces 12 and 14 and thus gaps 60 are formed between the plurality of pieces 12 and 14, to thereby form a secondary shielding sheet 200.

Here, since the secondary shielding sheet 200 is configured so that the amorphous ribbon 10 is formed into the plurality of pieces 12 and 14 and thus the gaps 60 are formed between the plurality of pieces 12 and 14, the amorphous ribbon 10 is oxidized if water is penetrated through the gaps 60, to thereby cause the appearance of the amorphous ribbon 10 to look bad and degrade shielding performance.

Thus, in order to prevent water from penetrating into the gaps 60 between the pieces 12 and 14, a process of forming an adhesive film 62 by filing the adhesive in the gaps 60 is performed (S60).

When the secondary shielding sheet is made to pass through the second pressing unit 400 or 500 at the room temperature or at a heat-applied temperature, a portion of the adhesive of the first adhesive layer 24 flows into the gaps 60 while the first adhesive layer 24 of the cover layer 20 is pressed, and further a portion of the adhesive of the second adhesive layer 44 flows into the gaps 60 while the double-sided tape 40 is pressed, to thereby form the adhesive film 62.

Here, any adhesive which may be deformed when being pressed at the room temperature may be used as the first adhesive layer 22 and the second adhesive layer 44. Otherwise, a thermoplastic adhesive which may be deformed when being heated may be used as the first adhesive layer 22 and the second adhesive layer 44.

In addition, the first adhesive layer 22 and the second adhesive layer 44 preferably have a thickness of at least 50% when compared to the thickness of the amorphous ribbon so as to sufficiently fill the gaps 60 between the fine pieces.

Figure 9:
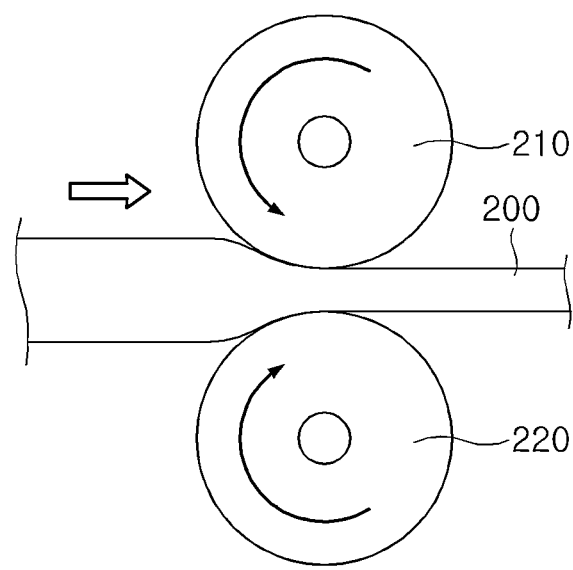
FIG. 9 is a side view showing an example of a second pressing unit in the present invention.
Figure 10:
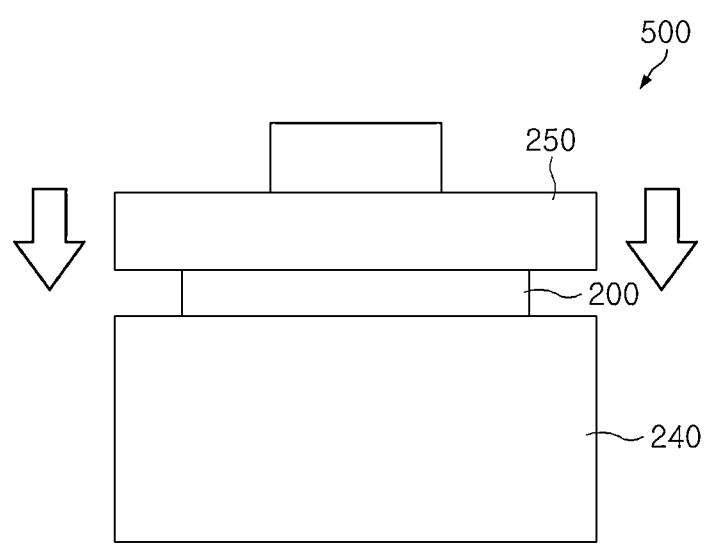
FIG. 10 is a side view showing another example of the second pressing unit in the present invention.

The second pressing unit may employ a roll press type 400 composed of a first pressing roller 210 and a second pressing roller 220 which is disposed at a predetermined interval from the first pressing roller 210, in which the secondary shielding sheet 200 passes between the first pressing roller 210 and the second pressing roller 220, as shown in FIG. 9, or may employ a hydraulic press type 500 composed of a lower pressing member 240 and an upper pressing member 250 which is disposed on the upper side of the lower pressing member 240 which moves up and down, as shown in FIG. 10.

Here, the spacing between the first pressing roller 210 and the second pressing roller 220 and the spacing between the upper pressing member 250 and the lower pressing member 240 when the upper pressing member moves in the lower direction are preferably set to be 50% or less when compared to the thickness of the secondary shielding sheet 200, so as to enable the adhesives of the first adhesive layer 22 and the second adhesive layer 44 to flow into the gaps 60.

Humidity Test

Figure 12:
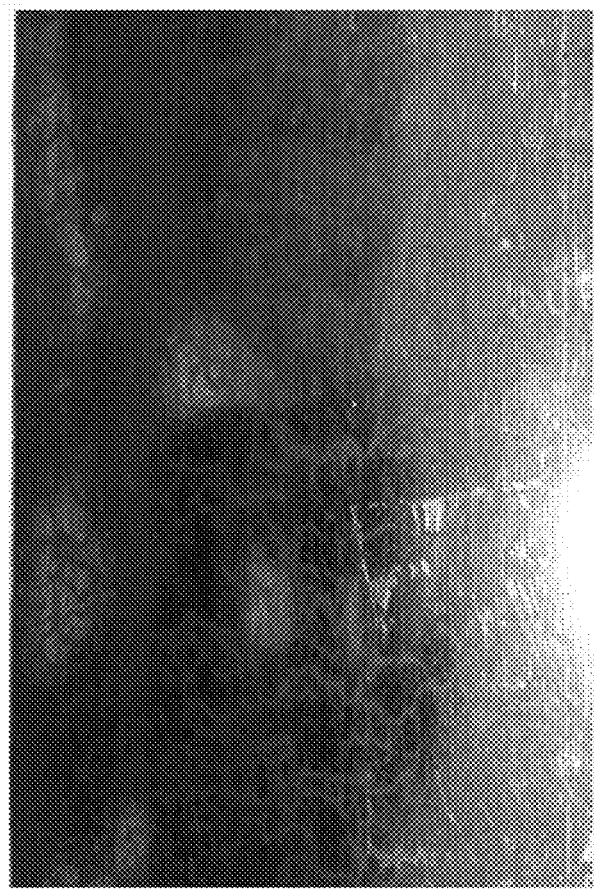
FIG. 12 is a close-up photo of a conventional secondary shielding sheet having not undergone a pressing process after flake-processing, in which the conventional secondary shielding sheet has passed through a humidity test.
Figure 13:
FIG. 13 is a close-up photo of a magnetic shield shielding sheet having undergone a pressing process after flake-processing, according to the present invention, in which the magnetic shield shielding sheet has passed through a humidity test.

FIG. 12 is a close-up photo of a conventional secondary shielding sheet having not undergone a pressing process after flake-processing, in which the conventional secondary shielding sheet has passed through a humidity test, and FIG. 13 is a close-up photo of a magnetic shield shielding sheet having undergone a pressing process after flake-processing, according to the present invention, in which the magnetic shield shielding sheet has passed through a humidity test.

A humidity test was conducted for 120 hours at temperature of 85° C. and humidity of 85% with respect to the secondary shielding sheet having not undergone a pressing process after flake-processing and the magnetic field shielding sheet that has undergone a pressing process after flake-processing according to the present invention.

As a result, as shown in FIG. 12, in the case of the secondary shielding sheet 200 where only the flake-processing was undergone, it can be seen that if water was penetrated into the gaps between a plurality of pieces when the amorphous ribbon was separated into the plurality of pieces, then the amorphous ribbon was oxidized, and thus the appearance of the amorphous ribbon was changed.

However, when the magnetic field shielding sheet underwent a pressing process after flake-processing and thus the adhesive films were formed in the gaps of the pieces according to the present invention as shown in FIG. 13, it can be seen that the magnetic field shielding sheet in accordance with the present invention shows the appearance that does not change.

Figure 14:
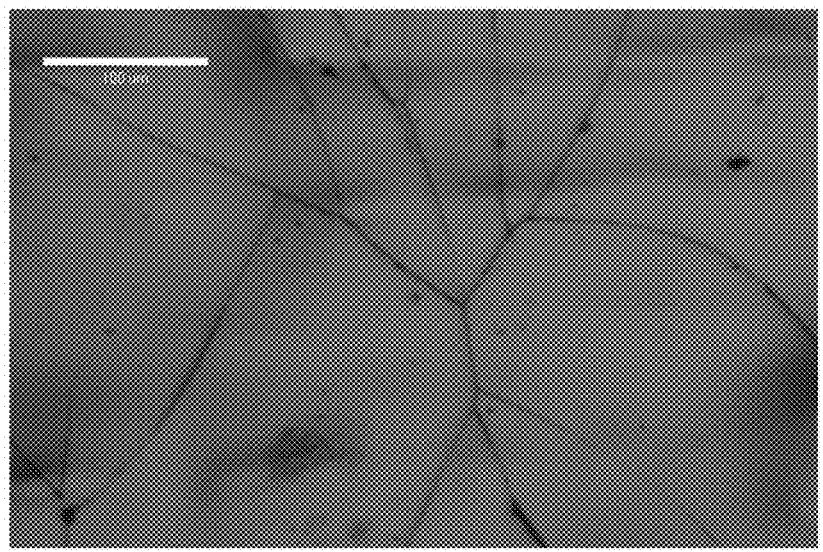
FIG. 14 is a close-up photo of a surface of an amorphous ribbon having not undergone a pressing process after flake-processing.
Figure 15:
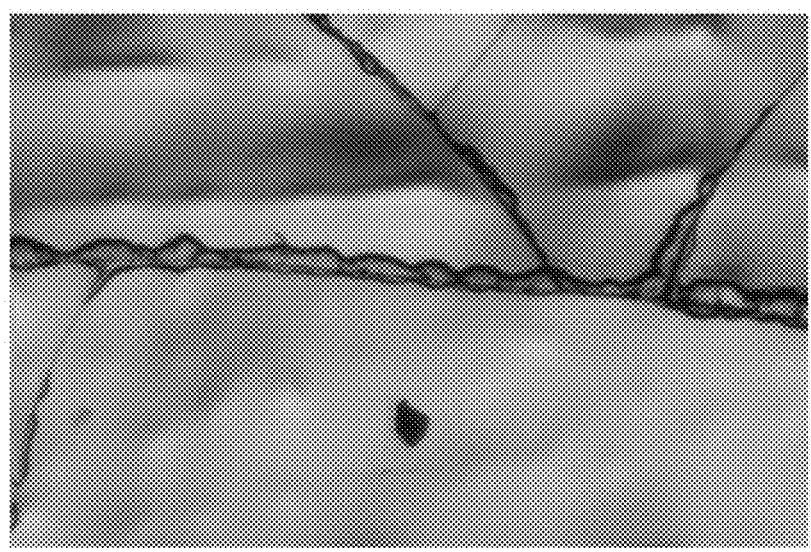
FIG. 15 is a close-up photo of a surface of an amorphous ribbon having undergone a pressing process after flake-processing, according to the present invention, to thus make an adhesive film filled in gaps.

Referring to FIG. 14, it can be seen that gaps exist between the pieces in the case of the amorphous ribbon separated into a number of pieces after flake-processing, and referring to FIG. 15, it can be seen that the adhesive films are filled in the gaps of the pieces when the pressing process is performed after flake-processing.

In the above-described embodiment, the magnetic field shielding sheet 300, which is obtained by inserting and stacking a single amorphous ribbon between the cover layer and the double-sided tape, and thereafter by undergoing flake-processing and pressing-process, has been illustrated. However, it is possible to form a magnetic field shielding sheet having a multilayer structure by undergoing flake-processing and pressing-process a laminated sheet which is obtained by inserting a plurality of amorphous ribbons between the cover layer and the double-sided tape, as needed, and inserting other double-sided tapes between the plurality of amorphous ribbons.

Figure 16:
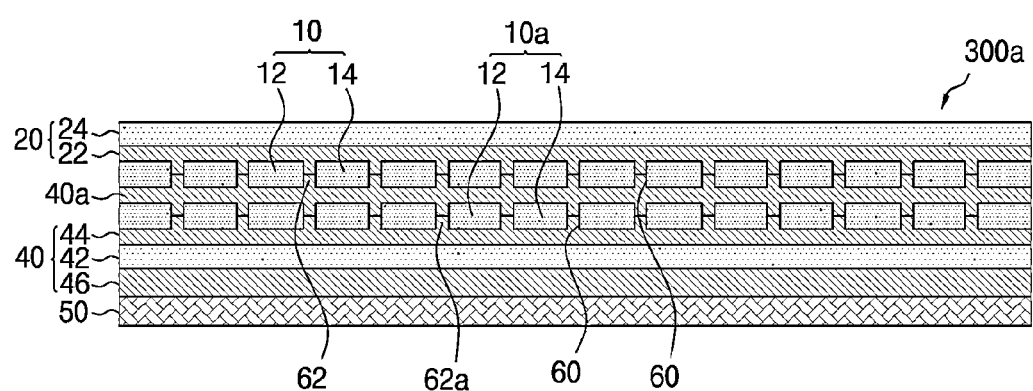
FIG. 16 is a cross-sectional view of a magnetic field shielding sheet according to another embodiment of the present invention.

FIG. 16 is a cross-sectional view of a magnetic field shielding sheet according to another embodiment of the present invention.

Referring to FIG. 16, the magnetic field shielding sheet 300a according to another embodiment of the present invention includes: two layers of amorphous ribbons 10 and 10a (e.g., ribbons or strips of an amorphous alloy) which are flake-processed and pressing-processed and thus separated into a large number of fine pieces 12 and 14; a cover layer 20 which is bonded on an exposed surface of one of the amorphous ribbons 10 and 10a; a double-sided tape 40 which is adhered on an exposed surface of the other of the amorphous ribbons 10 and 10a; and adhesive films 62 and 62a which are filled in gaps 60 between the large number of fine pieces 12 and 14 of each of the amorphous ribbons 10 and 10a, to prevent water from being penetrated into the gaps 60.

In this case, the double-sided tape 40a is inserted between the two-layered amorphous ribbons 10 and 10a in order to inhibit the flow of the fine pieces 12 and 14 at the time of flake-processing and pressing-processing. The double-sided tape 40a may be a type of including a substrate, but may be a type of including no substrate but being formed of only adhesive layers.

The magnetic field shielding sheet 300 according to another embodiment of the present invention has been illustrated with respect to the case that two layers of amorphous ribbons 10 and 10a have been used as shown in FIG. 16. However, it is possible to form a magnetic field shielding sheet having a multilayer structure by undergoing flake-processing and pressing-process a laminated sheet which is obtained by inserting and laminating the double-sided tape 40a between the two layers of amorphous ribbons 10 and 10a, as needed, and laminating the cover layer 20 and the double-sided tape 40 on the outer surface of which the release film 50 is attached on both surfaces of the two-layered amorphous ribbons.

In the magnetic field shielding sheet 300a according to another embodiment of the present invention, the same reference numerals as those of the magnetic field shielding sheet 300 according to the previous embodiment of the present invention are assigned for the same elements as those of the previous embodiment of the present invention, and thus detailed the description thereof will be omitted.

In addition, when manufacturing the magnetic field shielding sheet having a multilayer structure, the magnetic field shielding sheet 300a according to another embodiment of the present invention is manufactured in the same manufacturing process as the magnetic field shielding sheet 300 of the previous embodiment of the present invention, except that the double-sided tape 40a is inserted between the amorphous ribbons 10 and 10a.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention is applied in a magnetic field shielding sheet which can block the moisture from penetrating into amorphous ribbons to thus prevent an appearance problem due to oxidation and degradation of performance, which shields magnetic fields generated from a variety of components built in a portable terminal device, and is also applied to in a portable terminal device using the magnetic field shielding sheet.

The invention claimed is:

1. A magnetic field shielding sheet comprising:
    an amorphous ribbon which is formed into a plurality of pieces;
    a cover layer which is bonded on one surface of the amorphous ribbon;
    a double-sided tape which is adhered on the other surface of the amorphous ribbon; and
    an adhesive film which is filled in gaps between the plurality of pieces, to prevent water from penetrating into the gaps.

2. The magnetic field shielding sheet of claim 1, wherein the amorphous ribbon is made of a Fe-based amorphous alloy, which is heat treated at a first temperature range of 440° C. to 480° C.

3. The magnetic field shielding sheet of claim 1, wherein the thickness of the amorphous ribbon is in a range of 15~35 μm.

4. The magnetic field shielding sheet of claim 1, wherein the plurality of pieces are formed into several tenth of μm~3 mm in size.

5. The magnetic field shielding sheet of claim 1, wherein the cover layer comprises a first adhesive layer bonded on one surface of the amorphous ribbon and a cover film formed on the first adhesive layer,
    the double-sided tape comprises a substrate, a second adhesive layer formed on one surface of the substrate and on the other surface of the amorphous ribbon, and a third adhesive layer bonded on the other surface of the substrate, and
    the adhesive film is formed by adhesive material of the first and the second adhesive layers which penetrate into the gaps.

6. The magnetic field shielding sheet of claim 5, wherein the first adhesive layer and the second adhesive layer is formed of the adhesive which is deformed when the adhesive is pressurized at the room temperature or at a heat-applied temperature.

7. The magnetic field shielding sheet of claim 5, wherein the thicknesses of the first adhesive layer and the second adhesive layer are formed to be larger than 50% or more compared to the thickness of the amorphous ribbon.

8. A portable terminal device comprising the magnetic field shielding sheet of claim 1.

9. A method of manufacturing a magnetic field shielding sheet, the method comprising the steps of:
    heat-treating an amorphous ribbon;
    forming a cover layer on one surface of the amorphous ribbon;
    forming a double-sided tape on the other surface of the amorphous ribbon;
    flake-processing the amorphous ribbon on both surfaces of which the cover layer and the double-sided tape are respectively formed to thus be formed into a plurality of flake pieces; and
    forming an adhesive film for preventing water from penetrating in the gaps between the plurality of flake pieces.

10. The method of claim 9, wherein the heat-treatment of the amorphous ribbon is in progress for 30 minutes~2 hours at a temperature of 440° C.~480° C.

11. The method of claim 9, wherein the flake-processing is performed by making the amorphous ribbon on one surface of which the cover layer is formed and on the other surface of which the double-sided tape is formed pass through a first pressing unit consisting of a metal roller and a rubber roller which have irregularities.

12. The method of claim 9, wherein the flake-processing is performed by making the amorphous ribbon on one surface of which the cover layer is formed and on the other surface of which the double-sided tape is formed pass through a first pressing unit consisting of a metal roller on the outer surface of which a plurality of spherical balls are mounted and a rubber roller which is arranged at a predetermined distance from the metal roller.

13. The method of claim 9, wherein the forming the adhesive film is performed in the case that some of a first adhesive layer which bonds the cover layer on one surface of the amorphous ribbon and a second adhesive layer which bonds the double-sided tape on the other surface of the amorphous ribbon are filled in gaps formed between the plurality of flake pieces, by pressing the magnetic field shielding sheet.

14. The method of claim 13, wherein the second pressing unit employs one of a roll press type composed of a first pressing roller and a second pressing roller which are disposed at a predetermined interval, and a hydraulic press type composed of a lower pressing member and an upper pressing member which is disposed on the upper side of the lower pressing member which moves up and down, and the spacing between the first pressing roller and the second pressing roller and the spacing between the upper pressing member and the lower pressing member which move in the lower direction are set to be 50% or less when compared to the thickness of the shielding sheet before being pressed.

15. The method of claim 9, wherein the amorphous ribbon is made of a Fe-based amorphous alloy.

16. A magnetic field shielding sheet comprising:
   a plurality of amorphous ribbons between which a plurality of first double-sided tapes are inserted and laminated;
   a cover layer which is bonded on one exposed surface of the amorphous ribbons; and
   a second double-sided tape which is adhered on the other exposed surface of the amorphous ribbons,
   wherein each of the amorphous ribbons is made of a plurality of pieces having a gap therebetween, and some of the adhesive included in the cover layer, and the first and second double-sided tapes are penetrated into the gaps to prevent water from being penetrated into the gaps.

* * * * *